(12) United States Patent
Satoh et al.

(10) Patent No.: US 10,100,426 B2
(45) Date of Patent: Oct. 16, 2018

(54) METHOD FOR PRODUCING GALLIUM NITRIDE CRYSTAL

(71) Applicants: Takashi Satoh, Miyagi (JP); Seiji Sarayama, Miyagi (JP); Masahiro Hayashi, Miyagi (JP); Naoya Miyoshi, Miyagi (JP); Chiharu Kimura, Miyagi (JP); Junichi Wada, Miyagi (JP)

(72) Inventors: Takashi Satoh, Miyagi (JP); Seiji Sarayama, Miyagi (JP); Masahiro Hayashi, Miyagi (JP); Naoya Miyoshi, Miyagi (JP); Chiharu Kimura, Miyagi (JP); Junichi Wada, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/124,794

(22) PCT Filed: Nov. 27, 2014

(86) PCT No.: PCT/JP2014/081363
§ 371 (c)(1),
(2) Date: Sep. 9, 2016

(87) PCT Pub. No.: WO2015/141064
PCT Pub. Date: Sep. 24, 2015

(65) Prior Publication Data
US 2017/0022629 A1   Jan. 26, 2017

(30) Foreign Application Priority Data

Mar. 18, 2014   (JP) .................................. 2014-054470

(51) Int. Cl.
*C30B 9/10*   (2006.01)
*C30B 29/40*   (2006.01)
(Continued)

(52) U.S. Cl.
CPC .................. *C30B 9/10* (2013.01); *C30B 9/12* (2013.01); *C30B 29/406* (2013.01); *C30B 35/007* (2013.01)

(58) Field of Classification Search
CPC combination set(s) only.
See application file for complete search history.

(56) References Cited

U.S. PATENT DOCUMENTS

2008/0302297 A1   12/2008   Ichimura et al.
2009/0178611 A1   7/2009   Arena et al.
(Continued)

FOREIGN PATENT DOCUMENTS

CN      1671892 A      9/2005
CN    101370971 A      2/2009
(Continued)

OTHER PUBLICATIONS

European search report dated Jan. 19, 2017 in corresponding European Patent Application No. 14886576.9.
(Continued)

*Primary Examiner* — Erin Flanagan Bergner
(74) *Attorney, Agent, or Firm* — Cooper & Dunham LLP (57) ABSTRACT

A method for producing a gallium nitride crystal includes growing a gallium nitride crystal 5 by dissolving nitrogen in a mixed melt including gallium and sodium, and collecting the gallium 55 separated from an alloy 51 including the gallium and the sodium by reacting the alloy 51 and a liquid 52 that ionizes the sodium and separating sodium ions and the gallium 55 from the alloy.

12 Claims, 7 Drawing Sheets

(51) Int. Cl.
*C30B 9/12* (2006.01)
*C30B 35/00* (2006.01)

(56) References Cited

U.S. PATENT DOCUMENTS

| | | |
|---|---|---|
| 2009/0205563 A1 | 8/2009 | Arena et al. |
| 2009/0223441 A1 | 9/2009 | Arena et al. |
| 2009/0223442 A1 | 9/2009 | Arena et al. |
| 2009/0223453 A1 | 9/2009 | Arena et al. |
| 2009/0283029 A1 | 11/2009 | Arena et al. |
| 2010/0192839 A1 | 8/2010 | Hatakeyama et al. |
| 2010/0247418 A1 | 9/2010 | Sato et al. |
| 2012/0003446 A1 | 1/2012 | Satoh et al. |
| 2012/0048182 A1 | 3/2012 | Arena et al. |
| 2013/0104802 A1 | 5/2013 | Arena et al. |
| 2013/0187170 A1* | 7/2013 | Fukuyama ............ C30B 9/06 257/76 |
| 2013/0199441 A1 | 8/2013 | Arena |
| 2013/0327266 A1 | 12/2013 | Arena et al. |
| 2014/0041584 A1 | 2/2014 | Arena et al. |
| 2015/0315723 A1 | 11/2015 | Satoh et al. |

FOREIGN PATENT DOCUMENTS

| | | |
|---|---|---|
| CN | 101558188 A | 10/2009 |
| CN | 101851785 A | 10/2010 |
| CN | 102345170 A | 2/2012 |
| CN | 102272358 A | 12/2012 |
| CN | 103052739 A | 4/2013 |
| EP | 2402486 A1 | 1/2012 |
| JP | 2006-131454 | 5/2006 |
| JP | 2007-238343 | 9/2007 |
| JP | 2008-069028 | 3/2008 |
| JP | 2009-001470 | 1/2009 |
| JP | 2009-007207 | 1/2009 |
| JP | 2009-215085 | 9/2009 |
| JP | 2010-024125 | 2/2010 |
| JP | 2010-510687 | 4/2010 |
| JP | 2010-235330 | 10/2010 |
| JP | 2010-269986 | 12/2010 |
| WO | 2007/094126 | 8/2007 |
| WO | 2009/041053 | 4/2009 |
| WO | WO-2012008545 A1 * | 1/2012 ............ C30B 9/06 |

OTHER PUBLICATIONS

F. Kawamura et al. "Growth of GaN single crystals with extremely low dislocation density by two-step dislocation reduction", J. Cryst. Growth, 311(10): 3019-3024 (2009).

International Search Report dated Feb. 24, 2015 in PCT/JP2014/081363 filed on Nov. 27, 2014.

Masato Aoki, et al., "Growth of GaN single crystals from a Na—Ga melt at 750° C. and 5 MPa of $N_2$", Journal of Crystal Growth 218 (2000) 7-12, 2000.

Feb. 1, 2018 Chinese Official Action (and English translation thereof) in connection with corresponding Chinese patent application No. 201480077198.1.

* cited by examiner

METHOD FOR PRODUCING GALLIUM NITRIDE CRYSTAL

FIELD

The present invention relates to a method for producing a gallium nitride crystal, and in particular, to a technology for collecting residual gallium when the gallium nitride crystal is produced by a flux method.

BACKGROUND

A flux method is known as a method for producing group 13 nitride crystals such as gallium nitride crystals. In the flux method, a mixed melt (flux) containing an alkali metal or an alkali-earth metal and a group 13 element is formed in a reaction vessel, and a source gas such as nitrogen gas is dissolved in the mixed melt to form a supersaturated state. In the mixed melt, spontaneous nucleation of a group 13 nitride crystal occurs, or the group 13 nitride crystal is grown from a seed crystal as a nucleus.

When such a crystal is grown by the flux method, what remains in the reaction vessel after the growth step is a gallium nitride crystal, an alkali metal or alkali-earth metal, a group 13 element, and an alloy composed of the alkali metal or alkali-earth metal and the group 13 element. To take out the group 13 nitride crystal from the reaction vessel, the remaining alkali metal or alkali-earth metal, group 13 element, and alloy composed of the alkali metal or alkali-earth metal and the group 13 element need to be removed.

When the alkali metal or alkali-earth metal and the group 13 element that have been used as the mixed melt are collected and reused, productivity can be increased in mass production. Thus, what remains needed in the art is to collect the mixed melt in a reusable state. With regard to producing gallium nitride (GaN) crystals by using sodium (Na) as an alkali metal and gallium (Ga) as a group 13 element, the following methods are disclosed that relate to removal of sodium, gallium, and Ga—Na alloy that remain in the reaction vessel at the end of the crystal growth.

Methods for removing sodium from the reaction vessel are known. In such methods, sodium is removed by ionization of sodium by adding alcohol (ethanol in most cases) or water that reacts with sodium (when ethanol is added, sodium ethoxide is formed, and when water is added, sodium hydroxide solution is formed). Such removal methods, however, are highly reactive and there is a risk of igniting the alcohol or causing explosion of hydrogen gas. Patent Literature 1 discloses a method for controlling the temperature of alcohol and water to ensure safety. Patent Literature 2 discloses a method for separating and collecting sodium in a liquefied state. In this method, sodium is heated to a temperature above its melting point and is melt in a medium such as kerosene that is unreactive to sodium.

Methods for removing gallium from the reaction vessel are known. In such methods, gallium is removed by ionization of gallium by adding a strong acid such as hydrochloric acid, nitric acid, or aqua regia that reacts with gallium. Patent Literatures 3 and 4 disclose methods for removing gallium from crystals by heating the residual gallium in the reaction vessel to a temperature above its melting point (29.8° C.) after removal of sodium from the reaction vessel. Methods for removing Ga—Na alloy (intermetallic compound) are known as disclosed in Non Patent Literature 1. In Non Patent Literature 1, the alloy is removed by ionization of an element constituting the alloy by adding aqua regia that reacts with the alloy.

When gallium nitride crystals are produced by the flux method, raw material efficiency (consumed amount of a group 13 element/initial amount of the group 13 element× 100) is about 60 to 95%. As described in Patent Literatures 1, 3, and 4, and Non Patent Literature 1, when a few to several tens of grams of gallium is used, the unreacted gallium is not necessarily collected. However, when several hundreds to thousands of grams of gallium is used to produce a large gallium nitride crystal, collecting and reusing the unreacted gallium can reduce the production cost. Unfortunately, Patent Literatures 1 to 4 and Non Patent Literature 1 do not mention a method for separating and collecting gallium from Ga—Na alloy that remains in the reaction vessel at the end of the crystal growth.

With regard to producing gallium nitride crystals by using sodium as an alkali metal and gallium as a group 13 element, the following methods are disclosed that relate to removal of sodium and gallium that remain in the reaction vessel at the end of the crystal growth.

Patent Literature 5 discloses a method for removing an alloy composed of an alkali metal or an alkali-earth metal and a group 13 element by suction after crystal growth and before solidification of the mixed melt. After this process, a group 13 nitride crystal is taken out. This method, however, is unable to separate gallium and sodium in the alloy. Thus, it is difficult to obtain the precise composition ratio of gallium to sodium in the alloy that has been suction-removed to be reused as a mixed melt.

Patent Literature 6 discloses a method for removing the residual mixed melt by heating a crucible after crystal growth in an inert atmosphere to a temperature above the melting point of the mixed melt. When the mixed melt is removed by using a difference in vapor pressure between gallium and sodium, gallium and sodium can be separated. However, heating the mixed melt to 600° C., which is above the melting point of Ga—Na alloy, can cause leakage of sodium vapor, which poses an ignition or explosion threat, and thus is problematic in safety.

In addition to these problems, a large installation is needed to implement the methods disclosed in Patent Literatures 5 and 6. Thus, it is not easy to collect gallium and sodium separately from the reaction vessel after crystal growth.

SUMMARY

Technical Problem

Unfortunately, Patent Literatures 1 to 5 and Non Patent Literature 1 do not mention a method for collecting elemental gallium (gallium metal) from an alloy composed of gallium and sodium. The methods disclosed in Patent Literatures 5 and 6 are difficult to implement in a simple installation in a safe way to separate and collect gallium metal from an alloy composed of gallium and sodium.

When, for example, several hundreds to thousands of grams of gallium is used in the flux method to produce gallium nitride crystals, 5 to 40% of the amount of the gallium remains unreacted in the reaction vessel at the end of the crystal growth. If it is possible to separate and collect elemental gallium from Ga—Na alloy that remains in the reaction vessel at the end of the crystal growth, productivity can be improved.

The present invention is made in view of the foregoing, and it is an object of the present invention to provide a method for easily and safely collecting gallium from an alloy composed of gallium and sodium generated in a process of producing gallium nitride crystals using the flux method.

Solution to Problem

It is an object of the present invention to solve the above-mentioned problem. According to an aspect of the present invention, there is provided a method for producing a gallium nitride crystal, the method including: growing a gallium nitride crystal by dissolving nitrogen in a mixed melt including gallium and sodium; and collecting the gallium separated from an alloy including the gallium and the sodium by reacting the alloy and a liquid that ionizes the sodium and separating sodium ions and the gallium from the alloy.

Advantageous Effects of Invention

According to the present invention, gallium can be easily and safely collected from an alloy composed of gallium and sodium generated in a process of producing gallium nitride crystals using the flux method.

DESCRIPTION OF EMBODIMENT

First Embodiment

Figure 1:
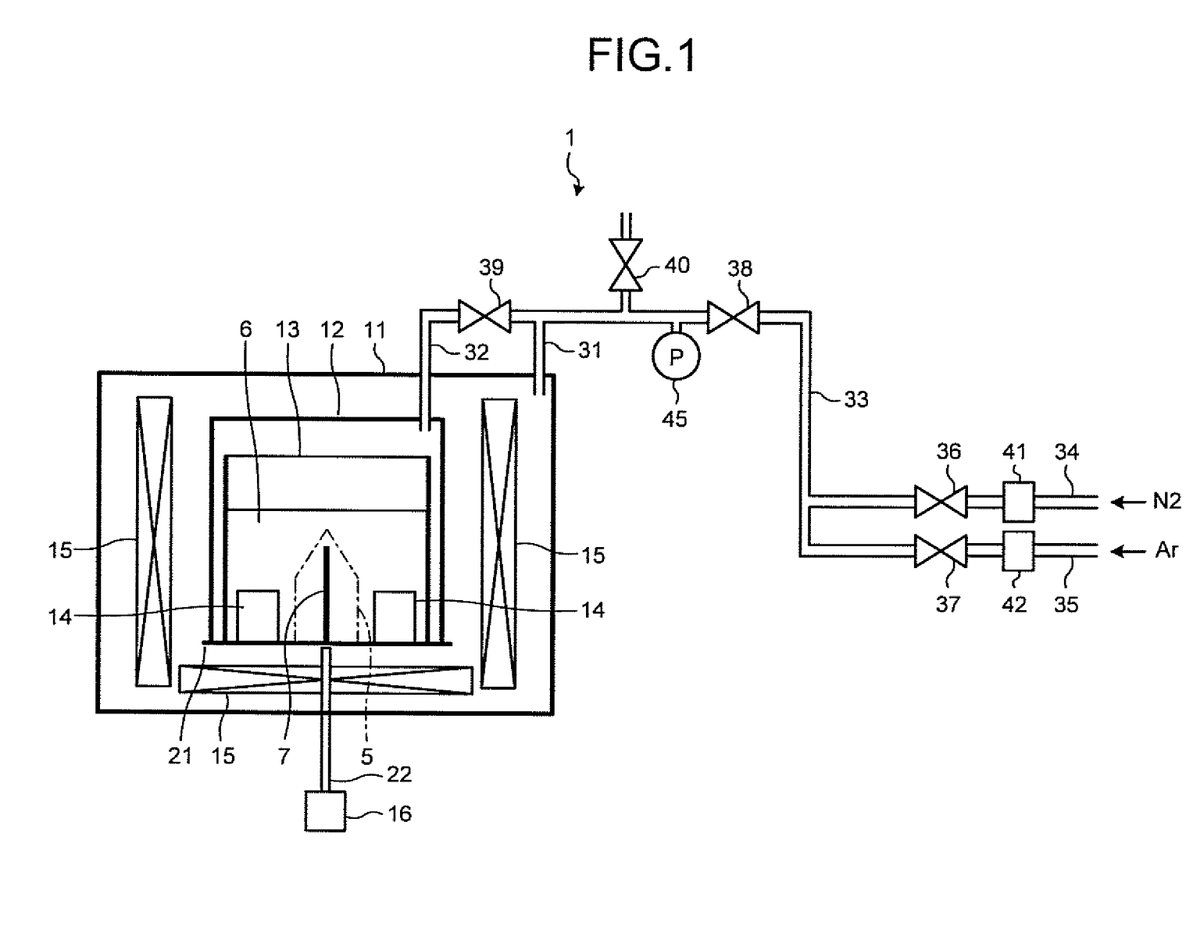
FIG. 1 is a diagram illustrating an example of a configuration of a production apparatus that is used in a method for producing a gallium nitride crystal according to a first embodiment.

The following describes in detail an embodiment of a method for producing a gallium nitride crystal with reference to the accompanying drawings. FIG. 1 is a diagram illustrating an example of a configuration of a production apparatus 1 that is used in the method for producing a gallium nitride crystal according to a first embodiment. The production apparatus 1 is an apparatus for producing a gallium nitride crystal 5 by using a flux method.

A pressure-resistant vessel 11 is made of, for example, stainless steel. Inside the pressure-resistant vessel 11, an inner vessel 12 is provided. Inside the inner vessel 12, a reaction vessel 13 is accommodated.

The reaction vessel 13 is a vessel for storing a Ga—Na mixed melt (flux) 6 and a seed crystal 7 and for growing the gallium nitride crystal 5. The material of the reaction vessel 13 is not limited to any particular material. Examples of the material of the reaction vessel 13 may include nitrides such as a sintered boron nitride (BN), and pyrolytic BN (P—BN), oxides such as alumina, yttrium aluminum garnet (YAG), and yttria, and carbides such as SiC. The inner wall of the reaction vessel 13, that is, the portion of the reaction vessel 13 in contact with the mixed melt 6, is preferably made of a material that is difficult to react with the mixed melt 6. Examples of such a material include nitrides such as BN, P—BN, and aluminum nitride, oxides such as alumina, YAG, and yttria, and stainless steel (SUS).

The mixed melt 6 contains at least gallium and sodium. In addition to galliumm, the mixed melt 6 may contain another group 13 element such as boron (B), aluminum (Al), indium (In), or thallium (Tl). In addition to sodium, the mixed melt 6 may contain another alkali metal such as lithium (Li) or potassium (K), and may contain an alkali-earth metal such as calcium (Ca), magnesium (Mg), strontium (Sr), or barium (Ba). The mixed melt 6 may contain carbon (C) as an additive to prevent generation of miscellaneous crystals and to accelerate crystal growth, and may contain germanium (Ge) as an n-type dopant.

Inside the reaction vessel 13, the seed crystal 7 is placed such that it is immersed in the mixed melt 6. In the first embodiment, the seed crystal 7 is fixed to the bottom of the reaction vessel 13. The seed crystal 7 is a gallium nitride crystal used as a nucleus from which the gallium nitride crystal 5 grows. Although, in the first embodiment, the seed crystal 7 is a prismatic crystal, the seed crystal 7 may be, for example, an acicular crystal, a pyramid-shaped crystal, a platelet crystal, or a wafer-like crystal. Although FIG. 1 illustrates a state in which one seed crystal 7 (gallium nitride crystal 5) is placed in the reaction vessel 13, a plurality of seed crystals 7 may be placed to produce a plurality of gallium nitride crystals 5 simultaneously.

Stirring the mixed melt 6 in the reaction vessel 13 makes the difference in the distribution of nitrogen concentration reduced in the mixed melt 6, which can improve crystal quality. Examples of methods for stirring the mixed melt 6 includes a method of mechanically shaking the pressure-resistant vessel 11, a method of rotating the inner vessel 12, and a method of stirring the mixed melt 6 by providing, for example, a propeller in the mixed melt 6. The method for stirring the mixed melt 6 indicated in FIG. 1 is rotating the inner vessel 12, for example. When the mixed melt 6 is stirred by the rotation of the inner vessel 12, placing structures 14 inside the reaction vessel 13 can further improve the stirring performance.

The inner vessel 12 is detachably installed on a turntable 21 in the pressure-resistant vessel 11. The turntable 21 is fixed to a rotating shaft 22, and is rotatable by a rotation mechanism 16 outside the pressure-resistant vessel 11. The rotation mechanism 16 rotates the rotating shaft 22 by, for example, a motor. The speed of rotation, the direction of rotation, and other properties of the rotating shaft 22 are controlled by a controller configured by, for example, a computer that operates in accordance with a computer program or various types of logical circuits. The inner vessel 12, the reaction vessel 13, the structures 14, and the like rotate with the rotation of the rotating shaft 22. Members that rotate with the rotation of the rotating shaft 22 are not limited to these members. For example, a heater 15 may also rotate, or only the reaction vessel 13 may rotate with the rotation. Rotation of the reaction vessel 13 rotates the seed crystal 7 and the structures 14, thereby stirring the mixed melt 6.

A source gas containing nitrogen is supplied to the pressure-resistant vessel 11. As illustrated in FIG. 1, pipes 31 and 32 are connected to the inner space of the pressure-resistant vessel 11 and to the inner space of the inner vessel 12, respectively, to supply nitrogen ($N_2$) gas that is a material of the gallium nitride crystal 5 and diluent gas for adjusting total pressure. A pipe 33 connected to the pipes 31 and 32 bifurcates upstream into a nitrogen supply pipe 34 and a diluent gas supply pipe 35. The nitrogen supply pipe 34 and the diluent gas supply pipe are provided with valves 36 and 37, respectively. The diluent gas is preferably argon (Ar) gas that is an inert gas, but the type of the diluent gas is not limited to this. For example, helium (He) or neon (Ne) may be used.

The nitrogen gas flows into the nitrogen supply pipe 34 from, for example, a gas cylinder to a pressure controller 41 at which the pressure of the nitrogen gas is adjusted, and to the pipe 33 via the valve 36. The diluent gas flows into the diluent gas supply pipe 35 from, for example, a gas cylinder to a pressure controller 42 at which the pressure of the diluent gas is adjusted, and to the pipe 33 via the valve 37. The pressure-adjusted nitrogen gas and diluent gas mix in the pipe 33 to form a mixed gas.

The mixed gas flows through the pipe 33 and the pipe 31 via a valve 38 to the inner space of the pressure-resistant vessel 11, and through the pipe 32 via a valve 39 to the inner space of the inner vessel 12. The inner space of the inner vessel 12 and the inner space of the reaction vessel 13 are in communication with each other in the pressure-resistant vessel 11, and have substantially the same atmosphere and pressure. The inner vessel 12 can be detached from the production apparatus 1. The pipe 33 is connected to the outside via a valve 40.

A pressure gauge 45 is provided to the pipe 33. The pressure in the inner spaces of the pressure-resistant vessel 11 and the inner vessel 12 (reaction vessel 13) can be adjusted by monitoring the pressure gauge 45. The partial pressure of nitrogen in the reaction vessel 13 can be adjusted by adjusting the pressure of the nitrogen gas by using the valve 36 and the pressure controller 41 and adjusting the pressure of the diluent gas by using the valve 37 and the pressure controller 42. This configuration can also adjust the total pressure in the pressure-resistant vessel 11 and the inner vessel 12. Thus, evaporation of the mixed melt 6 (for example, sodium) in the reaction vessel 13 can be prevented by increasing the total pressure in the inner vessel 12. In other words, this configuration can separately control the partial pressure of nitrogen and the total pressure, the former affects the growth conditions of the gallium nitride crystal, and the latter affects the evaporation of the mixed melt 6. Of course, it is acceptable to only introduce nitrogen gas to the reaction vessel 13 without introducing diluent gas. The entire configuration of the production apparatus 1 illustrated in FIG. 1 is presented for illustrative purposes only, and modifications on mechanisms for supplying gas that contains nitrogen to the reaction vessel 13 do not affect the scope of the present invention.

As illustrated in FIG. 1, heaters 15 are provided around and below the inner vessel 12 in the pressure-resistant vessel 11. The heaters 15 heat the inner vessel 12 and the reaction vessel 13 to adjust the temperature of the mixed melt 6.

Operation to provide the seed crystal 7, materials (gallium and sodium), additives such as carbon (C), and dopants such as germanium (Ge) into the reaction vessel 13 is preferably performed in a glovebox having an atmosphere of an inert gas such as argon gas with the inner vessel 12 being accommodated therein. The reaction vessel 13 may be accommodated in the inner vessel 12 in this operation.

The mole ratio of gallium to sodium contained in the mixed melt 6 is not limited to a particular ratio. The ratio $r_{Ga}$ of an amount of gallium [Ga] by mole relative to the total amount of gallium [Ga] and sodium [Na] by mole, which is expressed as [Ga]/([Ga]+[Na]), is preferably $0.05 \leq r_{Ga} \leq 0.60$.

After the materials and the like are provided, the heaters 15 are powered on to heat the inner vessel 12 and the reaction vessel 13 up to a crystal growth temperature. This operation melts the materials that are gallium and sodium, additives, and dopants in the reaction vessel 12, and the mixed melt 6 is formed. The mixed melt 6 is brought into contact with the source gas having a certain partial pressure of nitrogen, and the nitrogen is dissolved into the mixed melt 6. Such materials dissolved in the mixed melt 6 are supplied to the surface of the seed crystal 7, and the gallium nitride crystal 5 grows.

In such a crystal growth step, the rotation mechanism 16 rotates the reaction vessel 13, and the seed crystal 7 and the structures 14 rotate accordingly, thereby stirring the mixed melt 6. This operation makes the distribution of nitrogen concentration in the mixed melt 6 uniform. Growing a crystal in the mixed melt 6 having a uniform distribution of nitrogen concentration for a long time can produce a high-quality, large-sized gallium nitride crystal 5.

Figure 2:
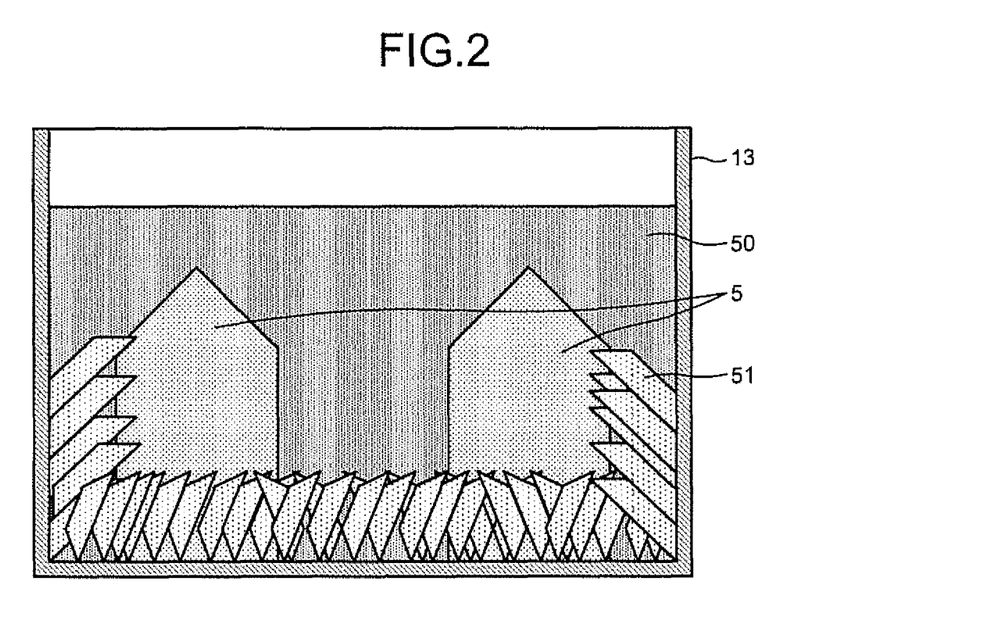
FIG. 2 is a diagram illustrating a state inside a reaction vessel at the end of crystal growth of gallium nitride crystals.

FIG. 2 is a diagram illustrating a state inside the reaction vessel 13 at the end of the crystal growth of gallium nitride crystals 5. In FIG. 2, two gallium nitride crystals 5 have been simultaneously grown in the reaction vessel 13. In the reaction vessel 13, the gallium nitride crystals 5 grown from seed crystals 7, residual sodium 50 (mixed melt 6), and an alloy 51 composed of gallium and sodium remain.

Figure 3:
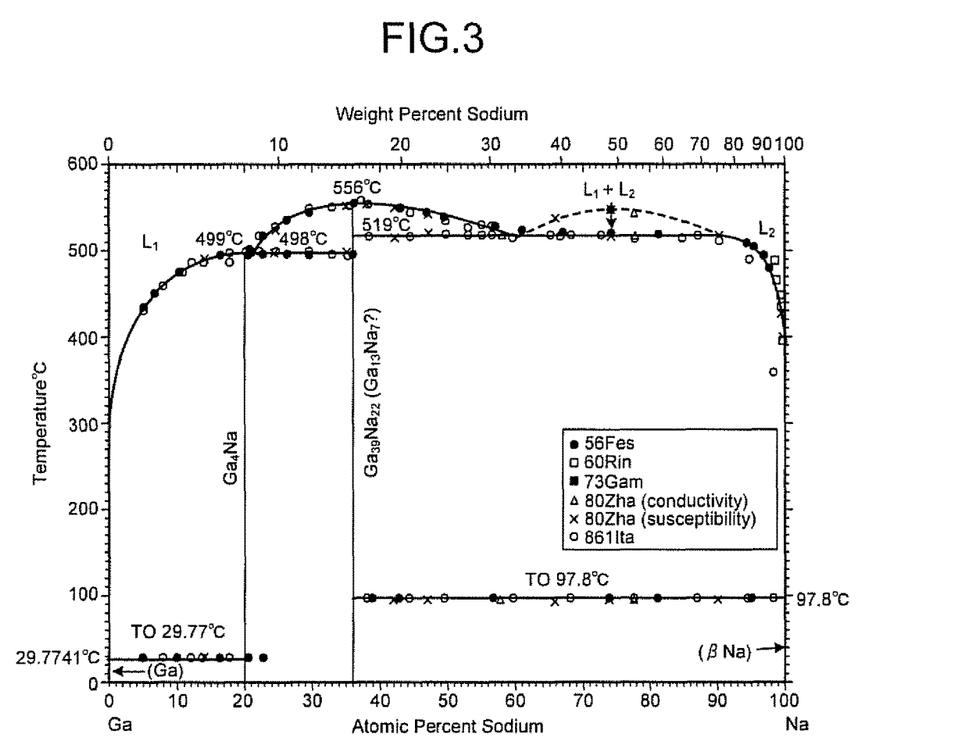
FIG. 3 is a Ga—Na phase diagram.

When gallium and sodium are used to grow the gallium nitride crystal 5, the substance that remains in the reaction vessel 13 at the end of the crystal growth varies with the composition ratio between sodium and gallium at the end of the crystal growth. FIG. 3 is a Ga—Na phase diagram (source: Bulletin Alloy Phase Diagrams, Vol. 11, No. 4, 1990, FIG. 1. Assessed Ga—Na Phase Diagram). When the ratio $r_{Ga}$ of the amount of gallium [Ga] by mole relative to the total amount of gallium [Ga] and sodium [Na] by mole, which is expressed as [Ga]/([Ga]+[Na]), satisfies $0 < r_{Ga} \leq 0.64$, sodium and $Ga_{39}Na_{22}$, which is the alloy 51 (intermetallic compound) composed of gallium and sodium, remain in the reaction vessel 13. When the ratio $r_{Ga}$ satisfies $0.64 \leq r_{Ga} \leq 0.80$, a mixture of $Ga_{39}Na_{22}$ and $Ga_4Na$, which are alloys 51 composed of gallium and sodium, remains in the reaction vessel 13. When the ratio $r_{Ga}$ satisfies $r_{Ga} \geq 0.80$, gallium and $Ga_4Na$, which is the alloy 51 composed of gallium and sodium, remain in the reaction vessel 13. The composition ratio (values of x and y) of the alloy 51 represented by $Ga_xNa_y$ may vary to some extent. Thus, the Ga—Na phase diagram illustrated in FIG. 3 is presented for illustrative purposes only. The composition ratios of the alloy 51 in the first embodiment will not be denied if they differ from those in other Ga—Na phase diagrams.

The inventors have conducted experiments of crystal growth and found that the ratio $r_{Ga}$ in the composition of gallium and sodium that is suitable for growing the gallium nitride crystal 5 falls within the range: $0.05 \leq r_{Ga} \leq 0.6$. It is more preferable that the ratio $r_{Ga}$ falls within the range: $0.1 \leq r_{Ga} \leq 0.4$. When crystal growth starts with the ratio $r_{Ga}$ within this range and ends with little sodium having been evaporated, the ratio $r_{Ga}$ at the end of crystal growth satisfies $r_{Ga} < 0.4$. In this case, what remains in the reaction vessel 13 is the gallium nitride crystal 5, the mixed melt 6 containing sodium 51, additives such as carbon (C), and dopants such as germanium (Ge), and $Ga_{39}Na_{22}$ that is an alloy 51 composed of gallium and sodium.

Figure 4:
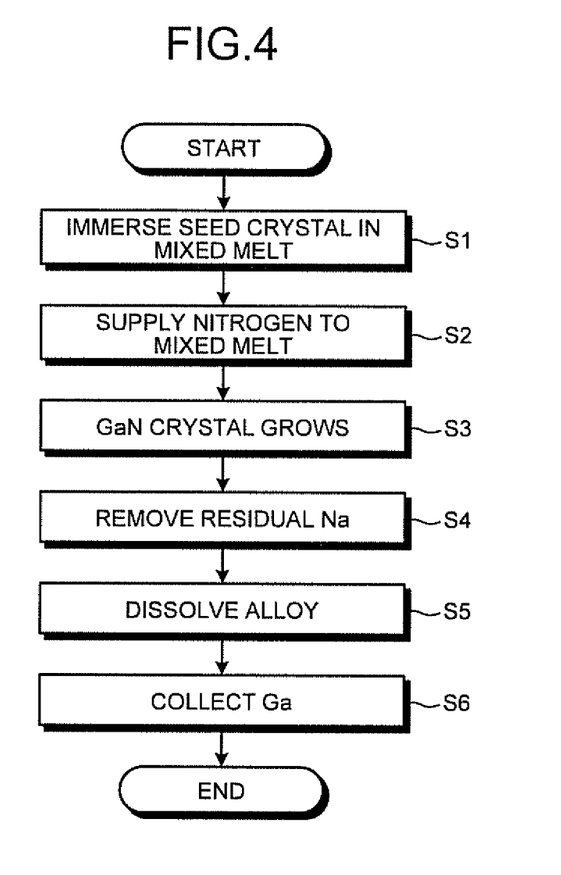
FIG. 4 is a flowchart illustrating the procedure from growth of a gallium nitride crystal to collection of gallium in the first embodiment.

FIG. 4 is a flowchart illustrating the procedure from growth of the gallium nitride crystal 5 to collection of gallium in the first embodiment. First, the seed crystal 7 is immersed in the mixed melt 6 in the reaction vessel 13 (S1).

Nitrogen is supplied to the mixed melt 6 under certain conditions (S2). The gallium nitride crystal grows from the seed crystal 7 used as a nucleus (S3). After the growth of the gallium nitride crystal 5, the sodium 50 that remains in the reaction vessel 13 is removed (S4). Subsequently, the alloy 51 that remains in the reaction vessel 13 is dissolved (S5), and elemental gallium is collected from the reaction vessel 13 (S6).

Described here is a step (S4) of removing the sodium 50 from the reaction vessel 13 after completion of the crystal growth. Any known method may be used as appropriate to remove the residual sodium 50 in the reaction vessel 13. For example, the sodium 50 may be removed such that the reaction vessel 13 is immersed in ethanol to make the sodium 50 sodium ethoxide. However, this method is not suitable for removing the sodium 50 in mass production because, when the residual sodium 50 amounts to some hundreds to thousands of grams, it will take a few to several hundreds of hours to remove all the sodium 50. A preferred method for removing the sodium 50 is heating the sodium 50 to a temperature above its melting point in an inert atmosphere to melt it and discharging the sodium 50 in a liquefied state as described in Patent Literature 6. Specifically, the reaction vessel 13 is placed on a hot plate and heated to 200° C. to 300° C. in a glovebox having an argon atmosphere therein. This process melts the sodium 50, and the sodium 50 can be discharged to another vessel. Most of the sodium 50 can be removed by this method. In this case, the reaction vessel 13 is heated to a temperature that exceeds the melting point of the sodium 50 but that does not exceed the melting point of the alloy 51 composed of gallium and aluminum. Thus, the gallium nitride crystal 5 and the alloy 51 remain in the reaction vessel 13.

Figure 5:
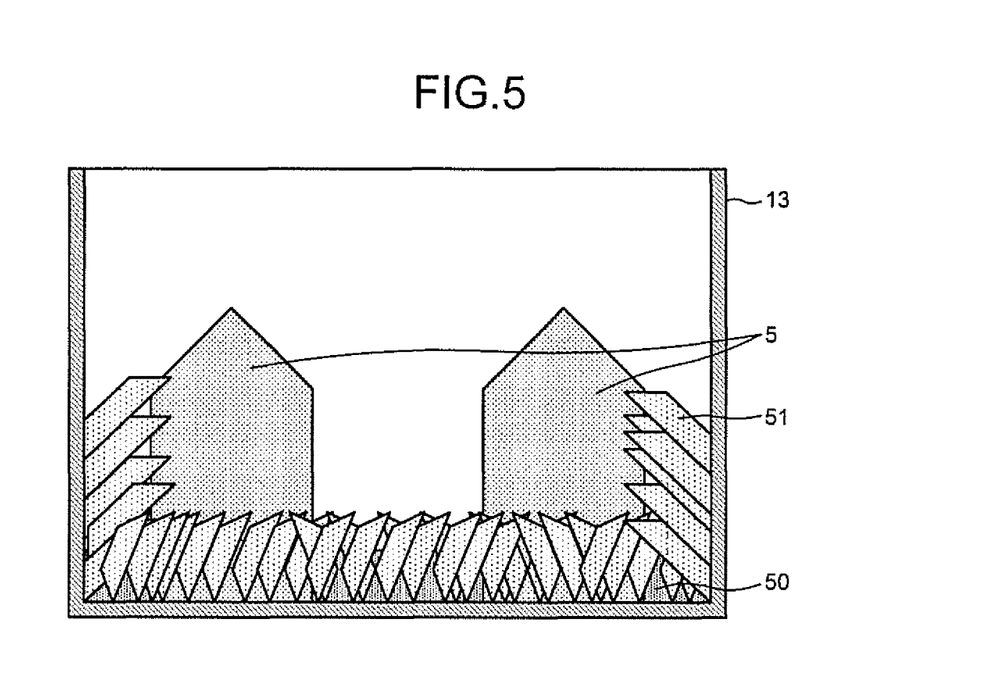
FIG. 5 is a diagram illustrating a state inside the reaction vessel from which residual sodium has been removed.

FIG. 5 is a diagram illustrating a state inside the reaction vessel 13 from which residual sodium 50 has been removed. In this state, most of the alloy 51 adheres to the inner wall of the reaction vessel 13 or to the surface of the gallium nitride crystals 5. The location where the alloy 51 is generated depends on the distribution of temperature in a cooling process of the crystal growth step around 556° C. that is the melting point of the alloy 51. In general, cooling occurs near the wall of the reaction vessel 13, and thus, the alloy 51 is generated on the inner wall of the reaction vessel 13. When a gallium nitride crystal 5 is located away from the inner wall of the reaction vessel 13, the gallium nitride crystal 5 can be taken out from the reaction vessel 13 only after removing the sodium 50 after completion of the crystal growth.

The form of the alloy 51 can be changed by changing the cooling rate around 556° C. that is the melting point of the alloy 51. For example, when the cooling process proceeds rapidly at a speed of 85° C./h or greater, nucleation of the alloy 51 occurs at various locations on the inner wall of the reaction vessel 13. This situation generates thin pieces of alloy 51 that are tangled with each other. When the sodium 50 is removed with the alloy 51 being tangled, a considerable amount of sodium 50 is left in the reaction vessel 13. When the cooling process proceeds slowly at a speed of 35° C./h or lower, the nucleation density is smaller than that in the rapid cooling. This situation can prevent the tangled state of the alloy 51. Thus, a smaller amount of sodium 50 is left in the reaction vessel 13 after the removal of sodium 50.

In view of the above, first, the reaction vessel 13 is heated to a temperature above the melting point of the sodium 50 in an inert atmosphere to melt only the sodium 50, and the sodium 50 in a liquefied state is discharged to another vessel. Then, the reaction vessel 13 is sufficiently cooled, and ethanol is added to the residual sodium 50, which was not removed in the discharge process, to make the sodium 50 an alkoxide to remove the sodium 50. With this operation, most of the residual sodium 50 can be removed from the reaction vessel 13.

Figure 6:
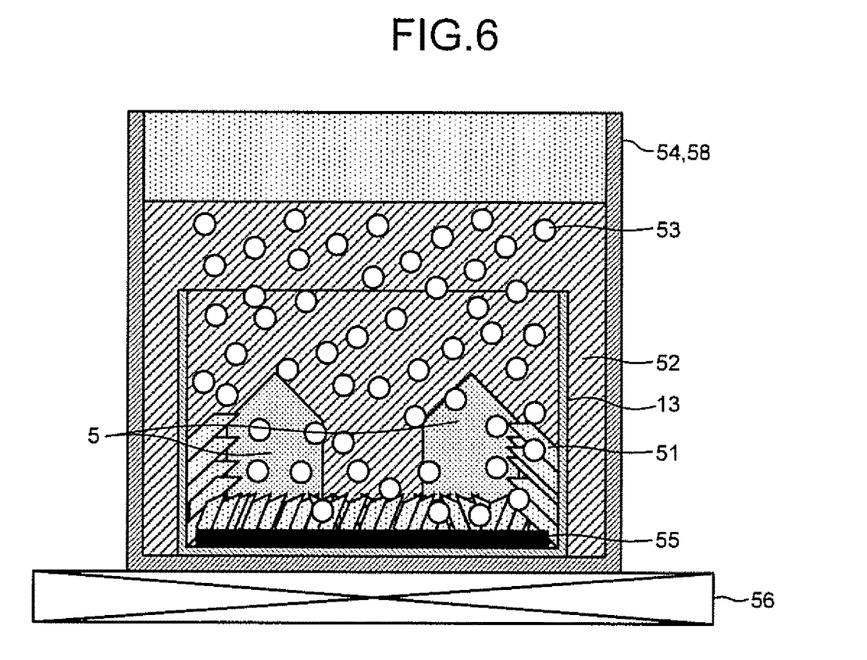
FIG. 6 is a diagram illustrating a state in which sodium ions and gallium are being separated from an alloy.

Described next is a step (S5) of dissolving the alloy 51 in the reaction vessel 13 after the removal of the sodium 50. FIG. 6 is a diagram illustrating a state in which sodium ions and the gallium 55 are being separated from the alloy 51.

After the removal of the sodium 50, the reaction vessel 13 is taken out from ethanol, and then immersed in water 52 in a vessel 54 made of stainless steel. The sodium 50 that remains in the reaction vessel 13 in small amounts reacts with the water 52, and hydrogen 53 is generated. Thus, this process should be performed in a fume hood. When the reaction between the sodium 50 and the water 52 is completed, the vessel 54 is placed on a hot plate 56 to be heated. The water 52 is heated to a high temperature, and the water 52 reacts with sodium in the alloy 51. This reaction separates the alloy 51 into sodium ions and the gallium 55. In this process, the water 52 reacts with the sodium contained in the alloy 51, and the hydrogen 53 is generated. Thus, this process also should be performed in the fume hood. Although FIG. 6 illustrates a state in which the alloy 51 adheres to the inner wall of the reaction vessel 13, the alloy 51 may be taken out from the reaction vessel 13 and caused to react with the water 52 outside the reaction vessel 13.

The reaction rate of dissolution of the alloy 51 increases with the temperature of the water 52. To dissolve the alloy 51 safely at a practical reaction rate, the temperature of the water 52 is preferably 50 to 90° C. (50° C. or higher and 90° C. or lower). For example, when the temperature of the water 52 is kept at room temperature (25° C.), it takes more than one week to dissolve about 300 g of alloy 51, which is completely impractical. When the temperature of the water 52 is kept at 50° C., it takes about 20 hours to dissolve about 300 g of alloy 51. In this case, generation of the hydrogen 53 proceeds not so rapidly, which is safe but unpractical. When the temperature of the water 52 is kept at 90° C., it only takes about two hours to dissolve about 300 g of alloy 51. However, rapid generation of the hydrogen 53 is likely, and thus additional safety precautions need to be taken. The inventors conducted studies on a practical reaction rate that ensures safety, and have found that the optimal temperature of the water 52 is around 70° C. When the temperature of the water 52 is kept at 70° C., about 300 g of alloy 51 can be dissolved in about three hours, and the generation of the hydrogen 53 is not so rapid that it will not exceed the explosion limit.

Figure 7:
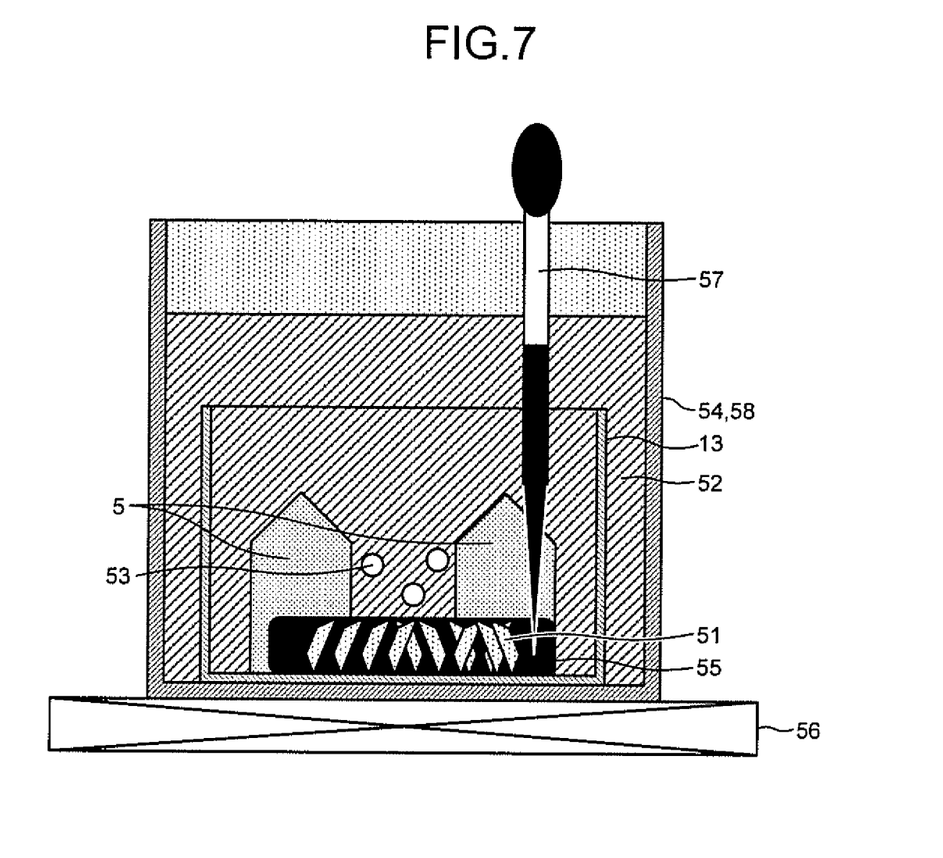
FIG. 7 is a diagram illustrating a state in which separated gallium is being collected.

Described next is a step (S6) of collecting the separated gallium 55 after dissolution of the alloy 51. FIG. 7 is a diagram illustrating a state in which the separated gallium 55 is being collected.

The reaction between the alloy 51 and the water 52 occurs at the surface of the alloy 51, and thus, a larger surface area of the alloy 51 or a larger contact area between the alloy 51 and the water 52 is preferred. As the dissolution proceeds, the separated gallium 55 may cover the surface of the alloy 51 in some cases. To prevent this situation, suction of the liquefied gallium 55 by a suction tool such as a pipette 57 is preferred so as not to inhibit the dissolution of the alloy 51. When the temperature of the water 52 is higher than the melting point (about 29.8° C.) of the gallium 55, the gallium 55 can be collected in a liquefied state. The water 52 does not react with the gallium 55, and thus, all the gallium 52 contained in the alloy 51 can be collected. The gallium 55 may be collected in a solidified state after cooling of the gallium 55.

Separation of the gallium 55 from the alloy 51 is achieved by using the water 52 that ionizes the sodium contained in the alloy 51. In other words, instead of using the water 52, any liquid that can ionize sodium contained in the alloy 51 can be used. Examples of such a liquid other than the water 52 include acids. Examples of the acids include hydrochloric acid, nitric acid, and aqua regia.

When an acid is used to dissolve the alloy 51 (ionize sodium contained in the alloy 51), liquid temperature gradually increases with the heat of reaction between the acid and the alloy 51. This heat of reaction can eliminate the need for a heating device such as the hot plate 56. Acids can react with the alloy 51 more rapidly than the water 52, and thus can reduce the processing time. However, acids also ionize the gallium 55 as well as sodium. Thus, there is a risk that all the gallium 55 contained in the alloy 51 cannot be collected.

Described next is a case of using an acid with reference to FIG. 6. After the sodium 50 in the reaction vessel 13 is removed (see FIGS. 2 and 5), the reaction vessel 13 is taken out from ethanol, and then is immersed in the water 52 in a vessel 58 made of glass as illustrated in FIG. 6. When the reaction vessel 13 is immersed in the water 52, the sodium 50 that remains in the reaction vessel 13 in small amounts reacts with the water 52, and the hydrogen 53 is generated. Thus, this process should be performed in a fume hood. After completion of the reaction between the sodium 50 and the water 52, the water 52 is replaced with an acid such as hydrochloric acid, nitric acid, or aqua regia. To prevent an explosive reaction, first, an acid diluted with water is added and then more acid is added little by little.

When the acid is added to the vessel 58, sodium contained in the alloy 51 reacts with the acid prior to the gallium in the alloy 51. Thus, the alloy 51 is separated into sodium ions and the elemental gallium 55. This process also generates the hydrogen 53, and thus should be performed in a fume hood. The temperature of the liquid in the vessel 58 increases with the heat of reaction between the acid and the alloy 51, thereby accelerating the reaction. Thus, it is preferable to add water into the vessel 58 little by little to ensure safety. To prevent rapid generation of the hydrogen 53 and to prevent reduction in an amount of gallium 55 to be collected due to the reaction between separated gallium 55 and the acid, the temperature of the processing liquid is preferably 30° C. to 120° C. To ionize sodium at a practical reaction rate, the temperature of the processing liquid is preferably 50 to 100° C., and optimally, around 80° C.

The reaction between the alloy 51 and the acid occurs at the surface of the alloy 51, and thus, a larger surface area of the alloy 51 or a larger contact area between the alloy 51 and the acid is preferred. As dissolution proceeds, the gallium 55 may cover the surface of the alloy 51. To prevent this situation, suction of the liquefied gallium 55 by a suction tool such as the pipette 57 is preferred so as not to inhibit the dissolution of the alloy 51. When the temperature of the liquid in the vessel 58 is higher than the melting point of the gallium 55, the gallium 55 can be collected in a liquefied state.

When an acid is used to dissolve the alloy 51, the gallium 55 reacts with the acid and a part of the gallium 55 is ionized, but most of the gallium 55 contained in the alloy 51 can be collected. The gallium 55 may be collected in a solidified state after cooling of the gallium 55.

When germanium (Ge) is added to the mixed melt 6 as an n-type dopant, Ga—Na—Ge alloy generated has a lower reaction rate with the water 52 than Ga—Na alloy. Thus, the temperature of the water 52 is preferably heated to 80° C. or higher. Ga—Na—Ge alloy is difficult to separate into sodium ions and the elemental gallium 55 by only using the water 52. To separate the alloy into sodium ions and the elemental gallium 55 at a practical rate, using acid is preferred.

The inventors conducted a study on whether the gallium 55 could be separated from an alloy 51 of $Ga_4Na$, which is, however, not included in the scope of the first embodiment. When the ratio $r_{Ga}$ in the composition of gallium and sodium at the end of the crystal growth is $r_{Ga} \geq 0.80$, gallium and $Ga_4Na$ that is an alloy 51 composed of gallium and sodium remain in the reaction vessel 13. The inventors conducted an experiment and found that sodium was difficult to separate from $Ga_4Na$ alloy as ions because of a large ratio of Ga in the alloy composition. For example, when the inventors caused the alloy 51 to react with aqua regia, sodium contained in the alloy 51 did not react with the aqua regia preferentially, but both sodium and gallium reacted with the aqua regia. Thus, separating and collecting the elemental gallium 55 from $Ga_4Na$ alloy was difficult.

First Example

The following describes a first example. In the first example, the production apparatus 1 according to the first embodiment was used to produce gallium nitride crystals 5. After completion of the crystal growth, the gallium 55 was separated from the alloy 51 that remained in the reaction vessel 13 and collected therefrom.

Crystal Growth

In the reaction vessel 13 made of alumina accommodated in a glovebox having a high-purity argon atmosphere therein, two seed crystals 7 were placed that were composed of gallium nitride (GaN) crystal having 50 mm in length in the c-axis direction and 1 mm in length in the m-axis direction. The seed crystals 7 were inserted into holes created on the bottom surface of the reaction vessel 13 to a depth of 4 mm.

Subsequently, heated and liquefied sodium (Na) was poured into the reaction vessel 13 as the mixed melt 6. After solidification of the sodium, gallium (Ga) and carbon were added. The mole ratio of gallium to sodium was set to 0.25:0.75. The amount of carbon added to the mixed melt 6 was 0.5% by mole relative to the total amount of gallium, sodium, and carbon by mole. Specifically, 1,000 g of gallium, 989 g of sodium, and 3.5 g of carbon were added.

The total pressure in the inner vessel 12 was set to 2.2 MPa to heat the reaction vessel 13 to a crystal growth temperature. The temperature condition was set to 870° C. and the nitrogen gas pressure was set to 3.0 MPa in the crystal growth step. The seed crystals 7 were left under the conditions for 1200 hours to achieve crystal growth.

Removal of Sodium

At the end of the crystal growth, gallium nitride crystals 5, the sodium 50, and the alloy 51 composed of sodium and gallium remained in the reaction vessel 13. The sodium 50 was removed by using a known method.

To remove the sodium 50, the reaction vessel 13 was placed on the hot plate 56 in the glovebox having an argon atmosphere therein and heated to 200° C. to melt the sodium 50, and then, the sodium 50 was discharged to another vessel. After the reaction vessel 13 was sufficiently cooled, the reaction vessel 13 was taken out from the glovebox and then put into the vessel 54 made of stainless steel. Subsequently, ethanol was poured into the vessel 54 to remove the sodium that was left after the removal in a fume hood.

Separation and Collection of Gallium

After the removal of the sodium 50, the gallium nitride crystals 5 and the alloy 51 remained in the reaction vessel 13. All the ethanol in the stainless steel vessel 54 was discharged, and then the water 52 was poured into the vessel 54. The vessel 54 was placed on the hot plate 56 and the temperature of the hot plate 56 was adjusted to regulate the temperature of the water 52 in the vessel 54 to about 70° C. The water 52 reacted with the sodium in the alloy 51, and the hydrogen 53 was generated. The gallium 55 separated from the alloy 51 was sucked out by the pipette 57 several times during the reaction. It took about three hours to complete the entire reaction. After the reaction between the water 52 and the alloy 51, the gallium nitride crystals 5 and liquefied gallium 55 remained in the reaction vessel 13. All the gallium 55 was sucked out by the pipette 57 and collected into another vessel. The collected amount of the gallium 55 was 218 g.

Removal of Crystal

After the processes described above, two bulk gallium nitride crystals 5 were taken out having 65 mm in length in the c-axis direction and 55 mm in length in the orthogonal direction of the c-axis. The yield (consumed amount of gallium/initial amount of gallium×100) was 78%. In other words, the amount of the gallium 55 that remained in the reaction vessel 13 at the end of the crystal growth was 220 g. Of this amount, 218 g of gallium 55 was collected. Thus, collection efficiency was 99%.

Recycle of Gallium

The collected gallium 55 was highly purified and was successfully reused as a material for another crystal growth. The collected gallium 55 did not contain impurities that would inhibit the high purification processing. The highly purified gallium 55 was used as a material for crystal growth, and another gallium nitride crystal 5 was successfully produced without causing any problems.

Second Example

In a second example, the same processes as in the steps of "Crystal Growth" and "Removal of Sodium" in the first example were performed, and then acid was used to collect the gallium 55.

Separation and Collection of Gallium

After the removal of the sodium 50, the gallium nitride crystals 5 and the alloy 51 remained in the reaction vessel 13. All the ethanol in the stainless steel vessel 54 was discharged, and then the water 52 was poured into the vessel 54. The vessel 54 was placed on the hot plate 56 and the temperature of the hot plate 56 was adjusted to regulate the temperature of the water 52 in the vessel 54 to about 70° C. The water 52 reacted with the sodium in the alloy 51, and the hydrogen 53 was generated. The gallium 55 separated from the alloy 51 was sucked out by the pipette 57 several times during the reaction. After one hour passed since the water 52 had been poured into the reaction vessel 13, the alloy 51 that remained in the reaction vessel 13 was moved to the vessel 58 made of glass. Water was poured into the vessel 58, and then nitric acid was added to make the ratio of nitric acid to water 1:2. The nitric acid reacted with the sodium in the alloy 51, and the hydrogen 53 was generated. The gallium 55 separated from the alloy 51 was sucked out by the pipette 57 several times during the reaction. The temperature of the liquid in the vessel 58 increased with the heat of reaction between the alloy 51 and the acid, and thus, water was added to regulate the temperature of the liquid to about 80° C. Nitric acid and hydrochloric acid were added little by little to increase the concentration of acid to keep the reaction rate. After the acids were added, it took about one hour to complete the entire reaction. Using acid for dissolution achieved reduction in the processing time by about one hour compared with a case in which only water was used for all the reaction. After the reaction between the acid and the alloy 51, the gallium nitride crystals 5 and liquefied gallium 55 remained in the reaction vessel 13. All the gallium 55 was sucked out by the pipette 57 and collected into another vessel. The collected amount of the gallium 55 was 200 g. In the second example, the water 52 was added before acid was added. However, acid such as nitric acid may be added at the beginning of the process without adding the water 52.

Removal of Crystal

After the processes described above, two bulk gallium nitride crystals 5 were taken out having 65 mm in length in the c-axis direction and 55 mm in length in the orthogonal direction of the c-axis. The yield (consumed amount of gallium/initial amount of gallium×100) was 78%. In other words, the amount of the gallium 55 that remained in the reaction vessel 13 at the end of the crystal growth was 220 g. Of this amount, 200 g of gallium 55 was collected. Thus, collection efficiency was 91%.

Recycle of Gallium

The collected gallium 55 was highly purified, and was successfully reused as a material for another crystal growth. The collected gallium 55 did not contain impurities that would inhibit the high purification processing. The highly purified gallium 55 was used as a material for crystal growth, and another gallium nitride crystal was successfully produced without causing any problems.

Third Example

Crystal Growth

In a third example, in the reaction vessel 13 made of alumina accommodated in a glovebox having a high-purity argon atmosphere therein, four wafer-like gallium nitride (GaN) seed crystals 7 each having a diameter of two inches were placed on the bottom of the reaction vessel 13.

Subsequently, heated and liquefied sodium (Na) was poured into the reaction vessel 13 as the mixed melt 6. After solidification of the sodium, gallium (Ga), carbon (C), and germanium (Ge) were added. The mole ratio of gallium to sodium was set to 0.25:0.75. The amount of carbon added was 0.5% by mole relative to the total amount of gallium, sodium, and carbon by mole. The amount of germanium added was 0.2% by mole relative to the amount of gallium by mole. Specifically, 400 g of gallium, 396 g of sodium, 1.4 g of carbon, and 8.5 g of germanium were added.

The total pressure in the inner vessel 12 was set to 2.2 MPa to heat the reaction vessel 13 to a crystal growth temperature. The temperature condition was set to 870° C. and the nitrogen gas pressure was set to 3.0 MPa in the crystal growth step. The seed crystals 7 were left under the conditions for 500 hours to achieve crystal growth.

The step of "Removal of Sodium" was conducted in the same manner as in the first example.

Separation and Collection of Gallium

After the removal of the sodium 50, the gallium nitride crystals 5 and the alloy 51 remained in the reaction vessel 13. All the ethanol in the stainless steel vessel 54 was discharged, and then the water 52 was poured into the vessel 54. The vessel 54 was placed on the hot plate 56 and the temperature of the hot plate 56 was adjusted to regulate the temperature of the water 52 in the vessel 54 to about 80° C. The water 52 reacted with the sodium in the alloy 51, and the hydrogen 53 was generated. Even after one hour passed since the water 52 had been poured, most of the alloy 51 remained unseparated, that is, not separated into sodium ions and the elemental gallium 55. The remaining alloy 51 was moved to the glass vessel 58. Water was poured into the vessel 58, and then nitric acid was added to make the ratio of nitric acid to water 1:2. The nitric acid reacted with the sodium in the alloy 51, and the hydrogen 53 was generated. The gallium 55 separated from the alloy 51 was sucked out by the pipette 57 several times during the reaction. The temperature of the liquid in the vessel 58 increased with the heat of reaction between the alloy 51 and the acid, and thus, water was added to regulate the temperature of the liquid to about 80° C. Nitric acid and hydrochloric acid were added little by little to increase the concentration of acid to keep the reaction rate. After the acids were added, it took about two hours to complete the entire reaction. Adding a small amount of Ge in the mixed melt 6 makes it difficult to separate sodium ions from the alloy 51, and more processing time is required than in the case of not adding Ge. After the reaction between the acid and the alloy 51, the gallium nitride crystals 5 and the liquefied gallium 55 remained in the reaction vessel 13. All the gallium 55 was sucked out by the pipette 57 and collected into another vessel. The collected amount of the gallium 55 was 85 g. In the third example, the water 52 was added before acid was added. However, acid such as nitric acid may be added at the beginning of the process without adding the water 52.

Removal of Crystal

After the processes described above, four bulk gallium nitride crystals 5 were taken out having 6 mm in length in the c-axis direction and two inches in diameter. The yield (consumed amount of gallium/initial amount of gallium× 100) was 74%. In other words, the amount of the gallium 55 that remained in the reaction vessel 13 at the end of the crystal growth was 104 g. Of this amount, 85 g of gallium 55 was collected. Thus, collection efficiency was 82%.

Recycle of Gallium

The collected gallium 55 was highly purified and was successfully reused as a material for another crystal growth. The collected gallium 55 did not contain impurities that would inhibit the high purification processing. The highly purified gallium 55 was used as a material for crystal growth, and another gallium nitride crystal 5 was successfully produced without causing any problems.

As described above, according to the above-mentioned embodiment, gallium can be collected by using a simple installation in a safe way from the alloy 51 composed of gallium and sodium generated in a process of producing a gallium nitride crystal using the flux method.

REFERENCE SIGNS LIST

1 Production apparatus
5 Gallium nitride crystal
6 Mixed melt
7 Seed crystal
11 Pressure-resistant vessel
12 Inner vessel
13 Reaction vessel
14 Structure
15 Heater
16 Rotation mechanism
21 Turntable
22 Rotating shaft
31, 32, 33 Pipe
34 Nitrogen supply pipe
Diluent gas supply pipe
36, 37, 38, 39, 40 Valve
41, 42 Pressure controller
50 Pressure gauge
50 Sodium
51 Alloy
52 Water
53 Hydrogen
54, 58 Vessel
55 Gallium
56 Hot plate
57 Pipette

CITATION LIST

Patent Literature

Patent Literature 1: Japanese Patent Application Laid-open No. 2009-215085
Patent Literature 2: International Patent Publication No. 2007/094126
Patent Literature 3: Japanese Patent Application Laid-open No. 2006-131454
Patent Literature 4: Japanese Patent Application Laid-open No. 2009-007207
Patent Literature 5: International Patent Publication No. 2009/041053
Patent Literature 6: Japanese Patent Application Laid-open No. 2010-269986
Non Patent Literature 1: J. Crystal Growth 218 (2000) 7-12

The invention claimed is:

1. A method for producing a gallium nitride crystal, the method comprising:
    (a) growing a gallium nitride crystal in a reaction vessel, by dissolving nitrogen in a mixed melt including gallium and sodium, in the reaction vessel, wherein an alloy that includes gallium and sodium forms in the reaction vessel during the growing of the gallium nitride crystal in (a);
    (a2) removing residual sodium remaining in the reaction vessel after (a), while leaving the gallium nitride crystal and the alloy that includes gallium and sodium, in the reaction vessel;
    (b) separating elemental gallium from the alloy that includes gallium and sodium, by reacting the alloy and a liquid that ionizes sodium and separating the sodium as sodium ions in the liquid and the elemental gallium from the alloy;
    (c) collecting the separated elemental gallium separated in (b); and
    (d) repeating (a) to further grow the gallium nitride crystal remaining after (a2) or to grow another gallium nitride crystal, by using the collected elemental gallium, which was collected in (c).

2. The method for producing a gallium nitride crystal according to claim 1, wherein the liquid is water having a temperature higher than a melting point of gallium.

3. The method for producing a gallium nitride crystal according to claim 2, wherein the temperature of the water is 50° C. or higher and 90° C. or lower.

4. The method for producing a gallium nitride crystal according to claim 1, wherein the liquid is an acid.

5. The method for producing a gallium nitride crystal according to claim 4, wherein the temperature of the acid is 30° C. or higher and 120° C. or lower.

6. The method for producing a gallium nitride crystal according to claim 1, wherein the collecting is performed when an amount of the gallium by mole relative to a total amount of the gallium and the sodium by mole in the mixed melt after the growing accounts for greater than 0% and 80% or less.

7. The method for producing a gallium nitride crystal according to claim 1, wherein the collecting is performed when an amount of the gallium by mole relative to a total amount of the gallium and the sodium by mole in the mixed melt after the growing accounts for greater than 0% and 64% or less.

8. The method for producing a gallium nitride crystal according to claim 1, wherein the alloy is an intermetallic compound composed of the gallium and the sodium.

9. The method for producing a gallium nitride crystal according to claim 8, wherein the intermetallic compound is a compound consisting substantially of $Ga_{39}Na_{22}$.

10. The method for producing a gallium nitride crystal according to claim 8, wherein the intermetallic compound includes germanium.

11. The method for producing a gallium nitride crystal according to-claim 1, wherein elemental gallium is collected in a liquefied state.

12. The method according to-claim 1, further comprising applying heat during (a) to melt the gallium and the sodium in the reaction vessel.

* * * * *